(12) United States Patent
DeCamillis et al.

(10) Patent No.: US 10,470,256 B2
(45) Date of Patent: Nov. 5, 2019

(54) METHOD AND APPARATUS FOR CONTROLLED BROADBAND MICROWAVE HEATING

(71) Applicant: APPLIED MATERIALS, INC., Santa Clara, CA (US)

(72) Inventors: Clayton R. DeCamillis, Raleigh, NC (US); Joseph M. Wander, Chapel Hill, NC (US); Richard C. Hazelhurst, Holly Springs, NC (US); Michael L. Hampton, Raleigh, NC (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 922 days.

(21) Appl. No.: 13/986,250

(22) Filed: Apr. 16, 2013

(65) Prior Publication Data

US 2014/0305934 A1    Oct. 16, 2014

(51) Int. Cl.
| | |
|---|---|
| *H05B 6/68* | (2006.01) |
| *H05B 6/70* | (2006.01) |
| *H05B 6/80* | (2006.01) |
| *H01L 21/67* | (2006.01) |

(52) U.S. Cl.
CPC ........ *H05B 6/686* (2013.01); *H01L 21/67115* (2013.01); *H05B 6/705* (2013.01); *H05B 6/80* (2013.01)

(58) Field of Classification Search
CPC . H05B 6/68; H05B 6/70; H05B 6/686; H05B 6/705; H05B 6/80; H05B 6/6447; H05B 6/666; H05B 6/687; H05B 6/745; H01L 21/67115

USPC ......... 219/751, 761, 702, 709–713, 718–716
See application file for complete search history.

(56) References Cited

U.S. PATENT DOCUMENTS

| | | | | |
|---|---|---|---|---|
| 2,751,518 | A * | 6/1956 | Pierce | 315/3.5 |
| 3,409,827 | A * | 11/1968 | Goggins, Jr. | 455/226.1 |
| 3,927,291 | A * | 12/1975 | Peterson | 219/717 |
| 4,210,795 | A * | 7/1980 | Lentz | H05B 6/6432 219/703 |
| 4,491,976 | A * | 1/1985 | Saitoh | H01P 7/082 455/183.1 |

(Continued)

FOREIGN PATENT DOCUMENTS

GB        797739 A  *  7/1958

OTHER PUBLICATIONS

International Preliminary Report on Patentability dated Oct. 29, 2015 for PCT Application No. PCT/US2014/032741.

*Primary Examiner* — Ibrahime A Abraham
*Assistant Examiner* — Biniam B Asmelash
(74) *Attorney, Agent, or Firm* — Moser Taboada; Alan Taboada

(57) ABSTRACT

A materials processing system comprises a thermal processing chamber and a broadband microwave power source. The power source includes an ovenized small-signal RF circuit, a high power microwave amplifier, and forward and reflected power detectors separated from one another by an isolator. The power detectors are also preferably ovenized. A control system provides control signals to the thermally stabilized VCO and VCA in the small-signal circuit to control output power based on detected forward power compared to demanded forward power. The system may be run in either open-loop or closed-loop modes.

17 Claims, 16 Drawing Sheets

(56) References Cited

U.S. PATENT DOCUMENTS

| | | | | |
|---|---|---|---|---|
| 4,517,430 | A * | 5/1985 | Slottag | H05B 6/666 219/716 |
| 4,812,778 | A * | 3/1989 | Gryk | G01F 15/068 318/678 |
| 5,132,632 | A * | 7/1992 | Russell | H03L 5/00 327/119 |
| 5,275,597 | A * | 1/1994 | Higgins | A61B 17/22 606/33 |
| 5,321,222 | A | 6/1994 | Bible et al. | |
| 5,430,275 | A * | 7/1995 | Braunisch | H05B 6/6411 177/208 |
| 5,463,357 | A * | 10/1995 | Hobden | H04N 7/20 332/145 |
| 5,521,360 | A | 5/1996 | Johnson et al. | |
| 5,648,038 | A * | 7/1997 | Fathi et al. | 264/406 |
| 5,721,286 | A * | 2/1998 | Lauf et al. | 522/1 |
| 5,738,915 | A | 4/1998 | Fathi et al. | |
| 5,770,977 | A | 6/1998 | Uurtamo | |
| 5,961,871 | A | 10/1999 | Bible et al. | |
| 6,760,230 | B2 * | 7/2004 | Kooker | H05K 9/0037 330/149 |
| 7,046,959 | B2 * | 5/2006 | Ammar | H04B 7/18528 455/12.1 |
| 7,834,573 | B2 * | 11/2010 | Lindsey | G01R 31/346 318/434 |
| 8,022,342 | B2 * | 9/2011 | Kanechika | 219/761 |
| 8,647,585 | B2 * | 2/2014 | Hancock | A61L 2/14 422/186 |
| 8,848,824 | B2 * | 9/2014 | Teetzel | H03F 1/3211 375/296 |
| 2006/0155270 | A1 * | 7/2006 | Hancock | A61B 18/18 606/33 |
| 2007/0210052 | A1 * | 9/2007 | Kanechika | 219/268 |
| 2007/0215607 | A1 | 9/2007 | Wander et al. | |
| 2008/0115967 | A1 | 5/2008 | Giboney et al. | |
| 2009/0038369 | A1 * | 2/2009 | Vondras | G01N 30/30 73/1.02 |
| 2009/0065502 | A1 * | 3/2009 | Suenaga et al. | 219/716 |
| 2010/0085124 | A1 * | 4/2010 | Stolpman | H03L 1/04 331/70 |
| 2010/0115785 | A1 * | 5/2010 | Ben-Shmuel et al. | 34/260 |
| 2011/0076787 | A1 | 3/2011 | Ahmad et al. | |
| 2011/0148948 | A1 | 6/2011 | Gandhi et al. | |
| 2011/0228255 | A1 * | 9/2011 | Li et al. | 356/33 |
| 2011/0290230 | A1 * | 12/2011 | Sim et al. | 126/198 |
| 2011/0290790 | A1 * | 12/2011 | Sim | H05B 6/686 219/716 |
| 2012/0152937 | A1 * | 6/2012 | Nordh | H05B 6/642 219/702 |
| 2012/0267361 | A1 * | 10/2012 | Ben-Shmuel | H05B 6/647 219/746 |
| 2013/0166232 | A1 * | 6/2013 | Lee | G01R 21/00 702/62 |

\* cited by examiner

FIGURE 5 THIS INVENTION

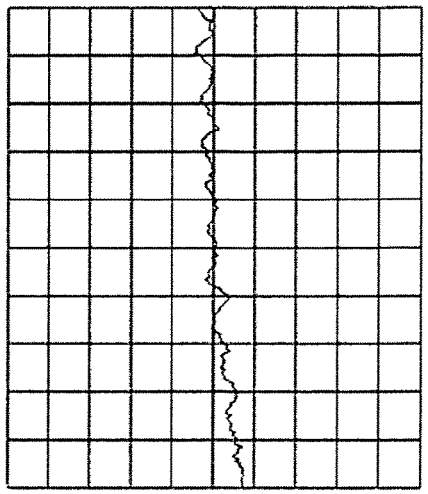
FIGURE 9B
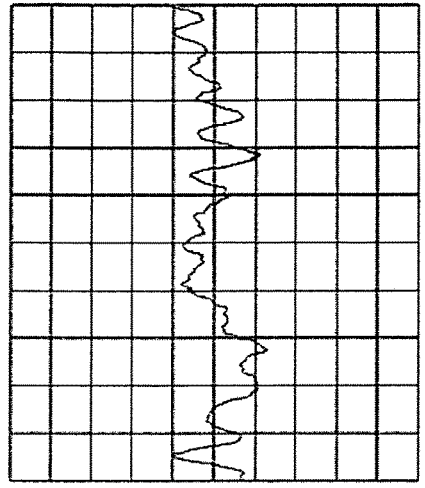
FIGURE 9D
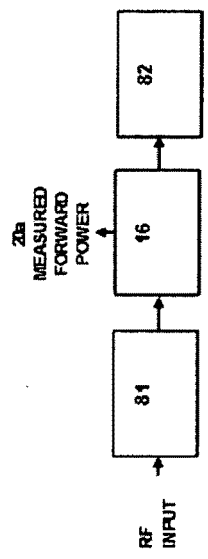
FIGURE 9A
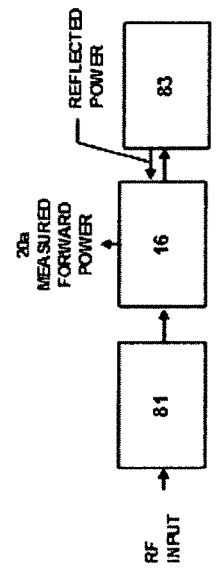
FIGURE 9C
FIGURE 9 PRIOR ART

FIGURE 10 THIS INVENTION

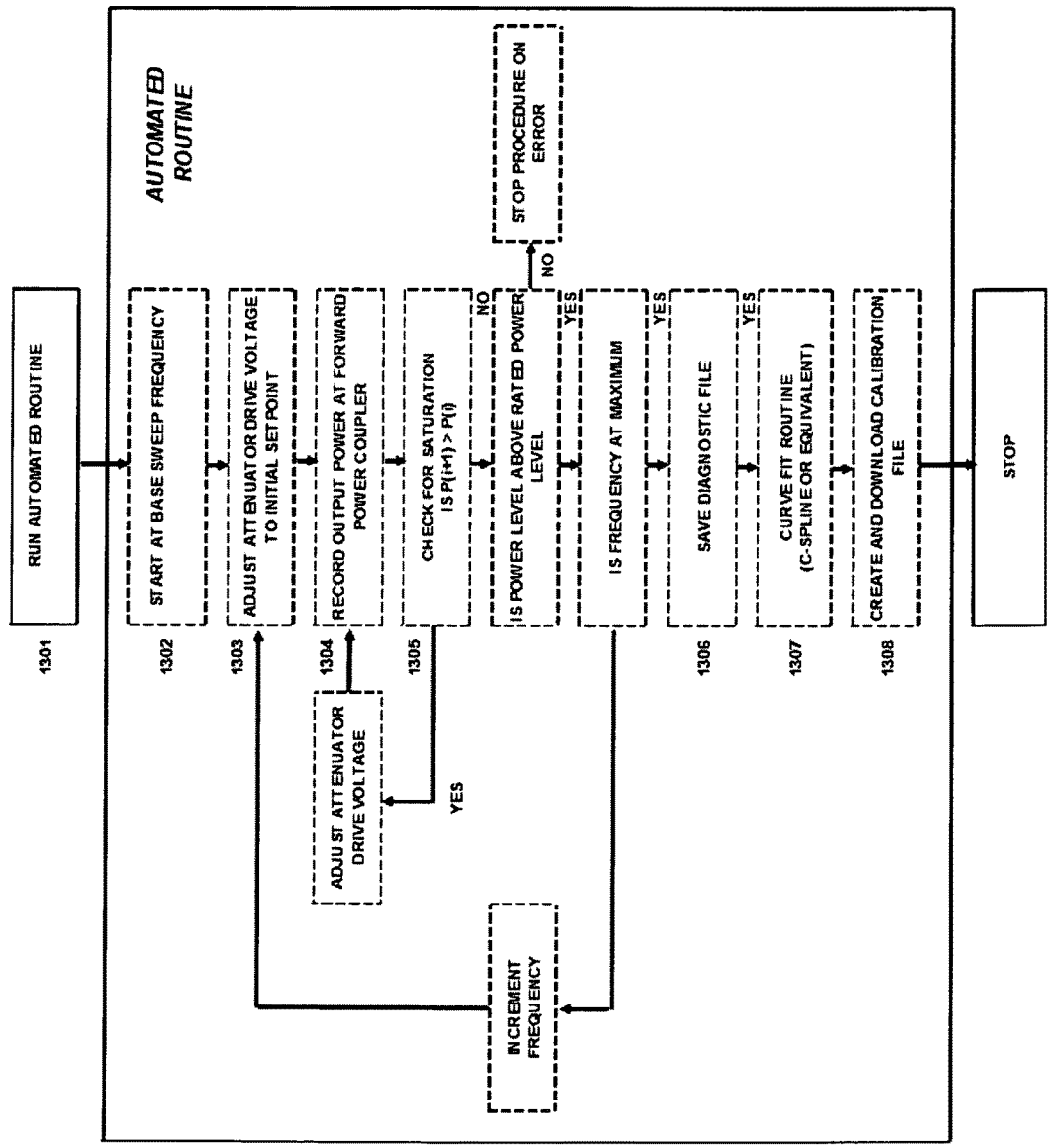
FIGURE 13 THIS INVENTION

THIS INVENTION

METHOD AND APPARATUS FOR CONTROLLED BROADBAND MICROWAVE HEATING

BACKGROUND OF THE INVENTION

Field of the Invention

The invention pertains to the field of processing materials using microwave energy. More particularly the invention pertains to apparatus and methods for generating precise levels of microwave power across a broad frequency range.

Description of Related Art

The use of microwave power for industrial processes, including heating, is well established and practiced on a large scale, particularly for applications such as drying, where the principle material to be acted upon is water. It has also more recently been applied to the curing of thermoset polymers and adhesives. It is well known that the use of a single-frequency microwave source in a multimode cavity can lead to non-uniformities related to the establishment of standing waves within the cavity. To solve this problem, Variable Frequency Microwave (VFM) systems were developed, as taught, for example, in U.S. Pat. Nos. 5,521,360; 5,721,286; and 5,961,871.

In general, VFM systems have a multimode applicator cavity and a microwave power supply capable of broadband operation; here, broadband is defined as the capability to sweep the applied frequency over some useful range about a chosen center frequency. Model calculations taught in U.S. Pat. No. 5,961,871 show the relationship between bandwidth, cavity size, and center frequency on the overall spatial uniformity of microwave energy in the cavity 18. The block diagram, FIG. 1, shows the prior art for a control system that includes a microwave power supply that typically has a microwave frequency source, comprising a voltage-tunable YIG oscillator and a voltage-controlled attenuator, whereby signals from a control system are applied to produce a small-signal microwave output of a given frequency, bandwidth, waveform, or other selected characteristics. This microwave signal is then passed to a high power microwave amplifier, typically a TWT, to produce a high power signal having the aforementioned selected characteristics. A control system monitors the forward and reverse microwave output power. A second control loop monitors the process using temperature, as shown, or another suitable process parameter and provides closed loop feedback to adjust the level of microwave power automatically.

As shown in FIG. 1:

Small signal components 10 include: a YIG oscillator 11, which generates microwave frequencies at low power; and a voltage controlled attenuator 12, which adjusts small signal RF power level. A fixed attenuator (not shown) limits maximum signal strength to a safe level, and an RF Bandpass Filter 13 ensures RF signal is in band for high power amplifier.

High Power Components include: a High Power Amplifier 14, which generates high power output from small signal input; and an Isolator 15, which prevents reflected power from the curing cavity reaching the high power amplifier.

Measurement Components include: a Directional coupler 16, which provides a highly attenuated RF signal useful for RF power measurement. Crystal Detectors 19 convert the low level RF signal from the Directional Coupler to a useful DC control voltage 20a, 20b.

In addition the prior art control system contains software based self calibration procedures to account for multiple systemic nonlinearities, e.g., the variation of TWT gain across the working bandwidth, FIG. 2. The microwave uniformity obtained with the aforementioned calibration routine, combined with closed-loop process control produce a level of microwave power output that has proven suitable for applications such as curing adhesives, curing polymers, processing ceramics in various applications, particularly those in electronics manufacturing.

However, in the development of processes for high value products such as thermal processing of semiconductor wafers, including coatings on wafers, it was found that the prior art variable or swept frequency control systems were unable to produce the precise level of control needed, and furthermore, that the calibration and setup procedures were cumbersome and time-consuming.

Objects and Advantages

Objects of the invention include: providing an improved broadband microwave source for heating and other purposes; providing a method for controlled microwave heating; providing a method for broadband microwave processing capable of open-loop operation; providing an improved method for processing semiconductor wafers; providing a VFM control system that is more robust and stable under varying environmental conditions; and providing a VFM control system that is easier to set up and calibrate.

These and other objects and advantages of the invention will become apparent from consideration of the following specification, read in conjunction with the drawings.

SUMMARY OF THE INVENTION

According to one aspect of the invention, a broadband microwave heating apparatus comprises:
an applicator cavity for exposing a workpiece to microwave energy;
a microwave power supply connected to the cavity, the power supply comprising:
  a small signal RF source comprising at least a voltage controlled microwave oscillator and a voltage controlled attenuator that are both thermally stabilized at a selected temperature above ambient:
  a high power microwave amplifier to amplify the small signal to a usable power level for heating;
  forward and reflected power detectors, the detectors thermally stabilized and separated from one another by a microwave isolator; and,
  a control system using a power regulator to adjust output power using detected forward power compared to demanded forward power.

According to another aspect of the invention, a broadband microwave power supply comprises:
a small signal RF source comprising at least a voltage controlled microwave oscillator and a voltage controlled attenuator that are both thermally stabilized at a selected temperature above ambient;
a high power microwave amplifier to amplify the small signal to a usable power level for heating;
forward and reflected power detectors, the detectors thermally stabilized and separated from one another by a microwave isolator; and,
a control system including a power regulator to adjust output power using detected forward power compared to demanded forward power.

According to another aspect of the invention, an integrated, low power microwave source comprises:
a voltage controlled oscillator (VCO);
a voltage controlled attenuator (VCA);

a heater and temperature control circuit; and, a package containing the VCO, VCA, heater, and temperature control circuit and having external connections for DC power, DC frequency control voltage, DC amplitude control voltage, and RF signal out.

According to another aspect of the invention, a method of heating materials using broadband microwave power, comprises the steps of:

placing a selected workpiece in a multi-mode microwave applicator cavity;

providing a microwave power supply in communication with the cavity, the power supply including a small-signal RF generating circuit, a high power microwave amplifier, and forward and reflected power detectors, the detectors thermally stabilized and separated from one another by an isolator;

heating at least some of the components of the small-signal RF circuit to a selected temperature above ambient; and, providing a control system to perform the following functions:
   run an automatic power leveling routine to automatically generate an autolevel table and download said autolevel table to the control system;
   provide an automatic power control system to limit the rate of power adjustment.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

FIG. 9 compares forward power measurements 9B, 9D into a dummy load 9A and into a short 9C, respectively, using the configuration of the Prior Art.

FIG. 13 shows the autolevel process in accordance with one aspect of the current invention.

DETAILED DESCRIPTION OF THE INVENTION

The invention provides an novel and improved microwave processing technique for the treatment of high value or critical materials such as semiconductor wafers, which require uniformity and a high degree of process stability.

The rapid processing approach involves the use of Variable Frequency Microwave (VFM) heating, a well-known process taught in at least the following U.S. Patents, each of which is incorporated herein by reference in its entirety: U.S. Pat. Nos. 5,321,222; 5,721,286; 5,961,871; 5,521,360; and 5,738,915. For example, U.S. Pat. No. 5,738,915 by Fathi et al. teaches the use of VFM for rapid curing of polymeric films on semiconductor wafers. It should be noted that although single or fixed frequencies can be used for microwave heating of semiconductors, they generally produce non-uniform heating, and when metal films are involved arcing with these films becomes a serious issue. However, the continuous sweeping of frequencies over the bandwidth being used with VFM, as taught in the aforementioned references, reduces the potential for arcing and subsequent damage. Numerous kinds of wafers with integrated circuits have been exposed to VFM and it has been demonstrated that there is no damage to the circuits or their functionality. The use of VFM provides more rapid processing as compared to other annealing furnaces. Additional process monitoring techniques are taught by Fathi et al. in U.S. Pat. No. 5,648,038, the entire disclosure of which is incorporated herein by reference.

Figure 3:
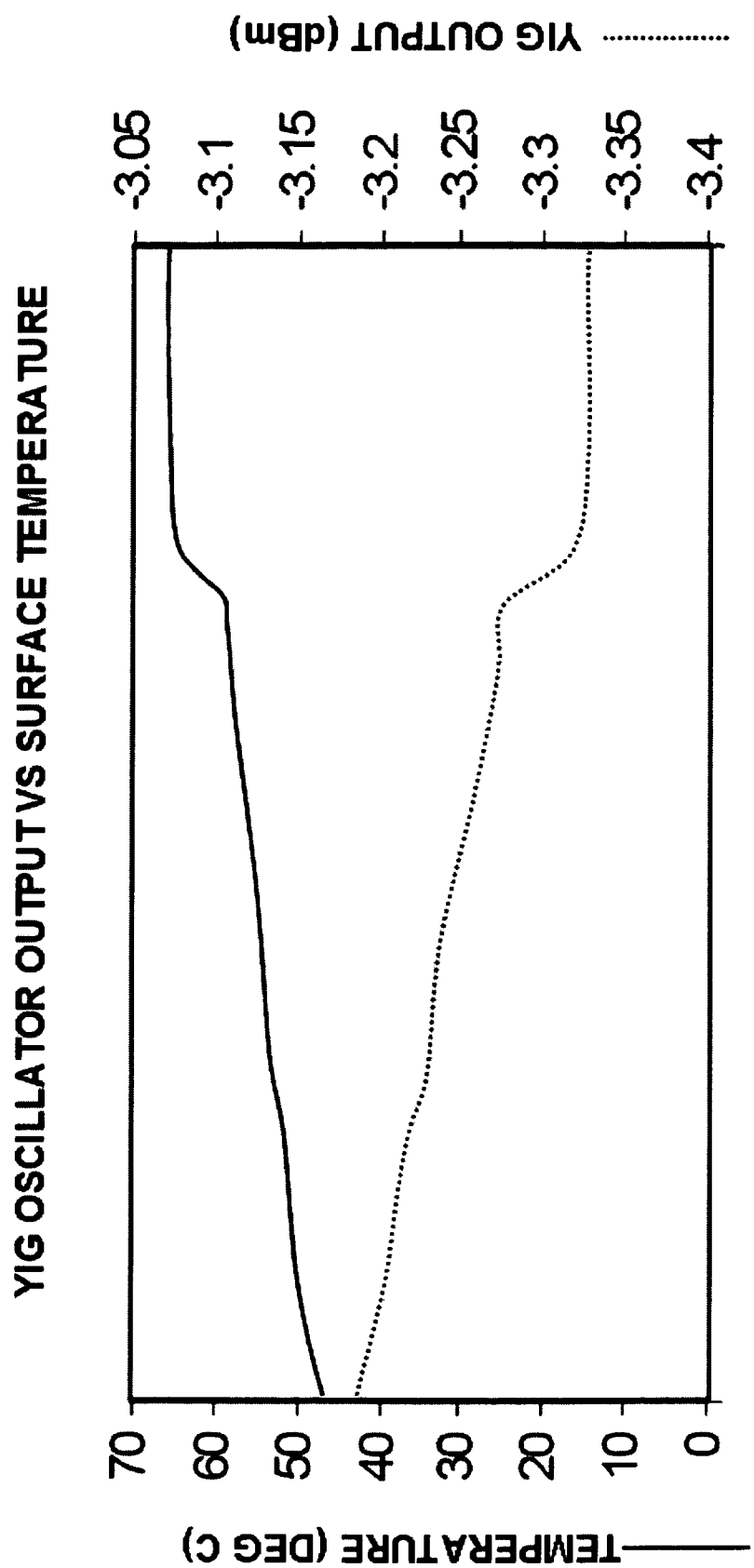
FIG. 3 illustrates the change in YIG oscillator output with time as the surface temperature of the device changes.
Figure 15:
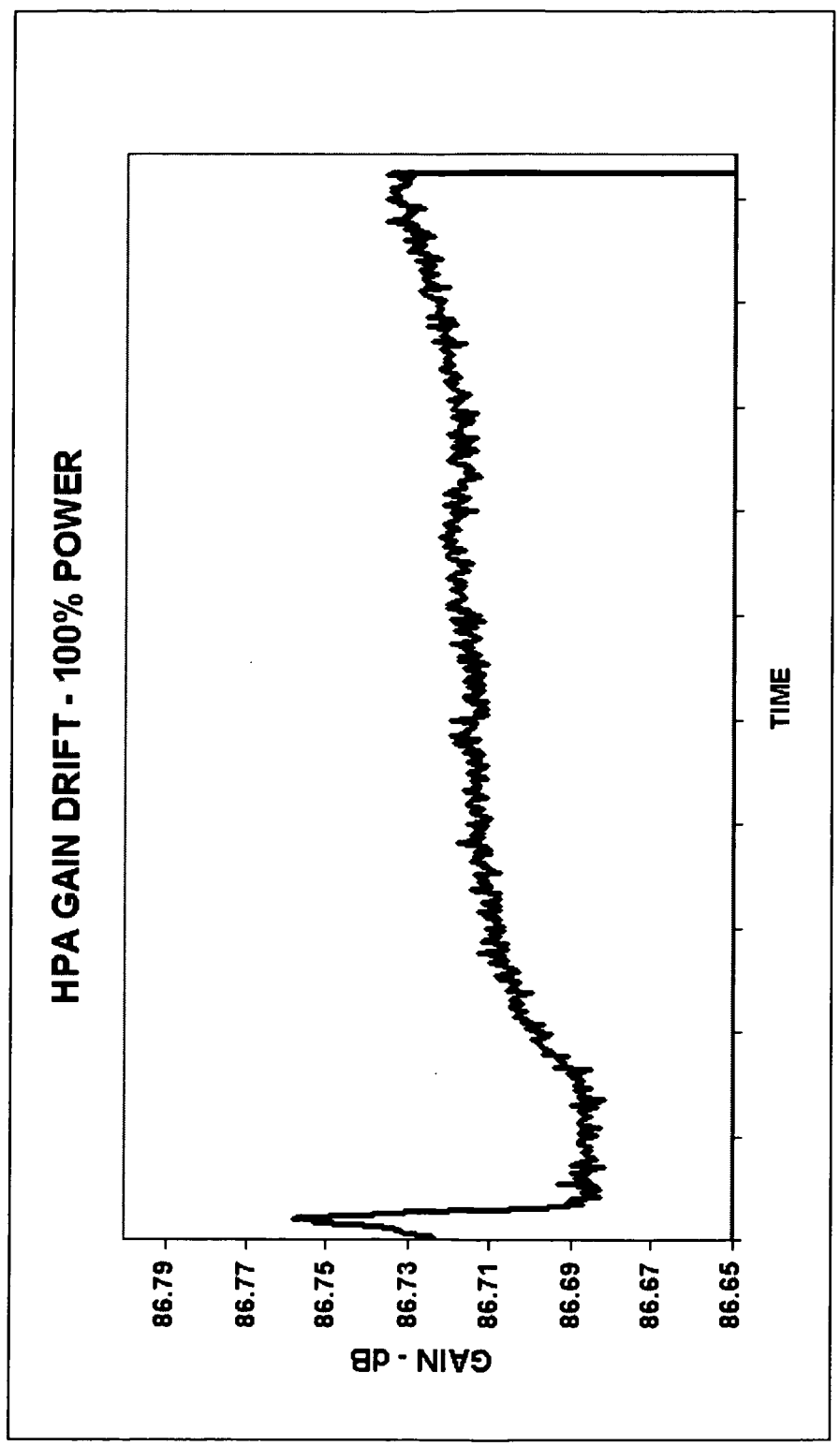
FIG. 15 illustrates the typical gain drift of a high power amplifier of the type used in broadband microwave heating systems.

In developing VFM systems for semiconductor processing, comprehensive investigation showed that existing control strategies were unable to maintain the required level of precision, for several reasons. Applicants found significant gain sensitivity (output variation) of the small signal components, specifically the YIG Oscillator 11 and Voltage controlled attenuator 12 as a function of the environmental operating temperature. In addition the stability of the YIG oscillator output from self heating after power on had a measureable impact. FIG. 3 shows the change in power output of a typical YIG oscillator as a function of time, showing power decreasing from self-heating of the device, and then a significant change when a secondary heat source is applied to the baseplate. Applicant also found that the gain of high power components such as the TWTA will drift, or vary unpredictably with time and temperature as shown in FIG. 15. Furthermore the extremely high gain, physical size and power consumption of these components make it prohibitive to stabilize them using traditional techniques. In addition to the larger components, the gain drift of the other high power components including the isolator and the numerous small signal transmission line components are difficult to quantify.

Figure 4:
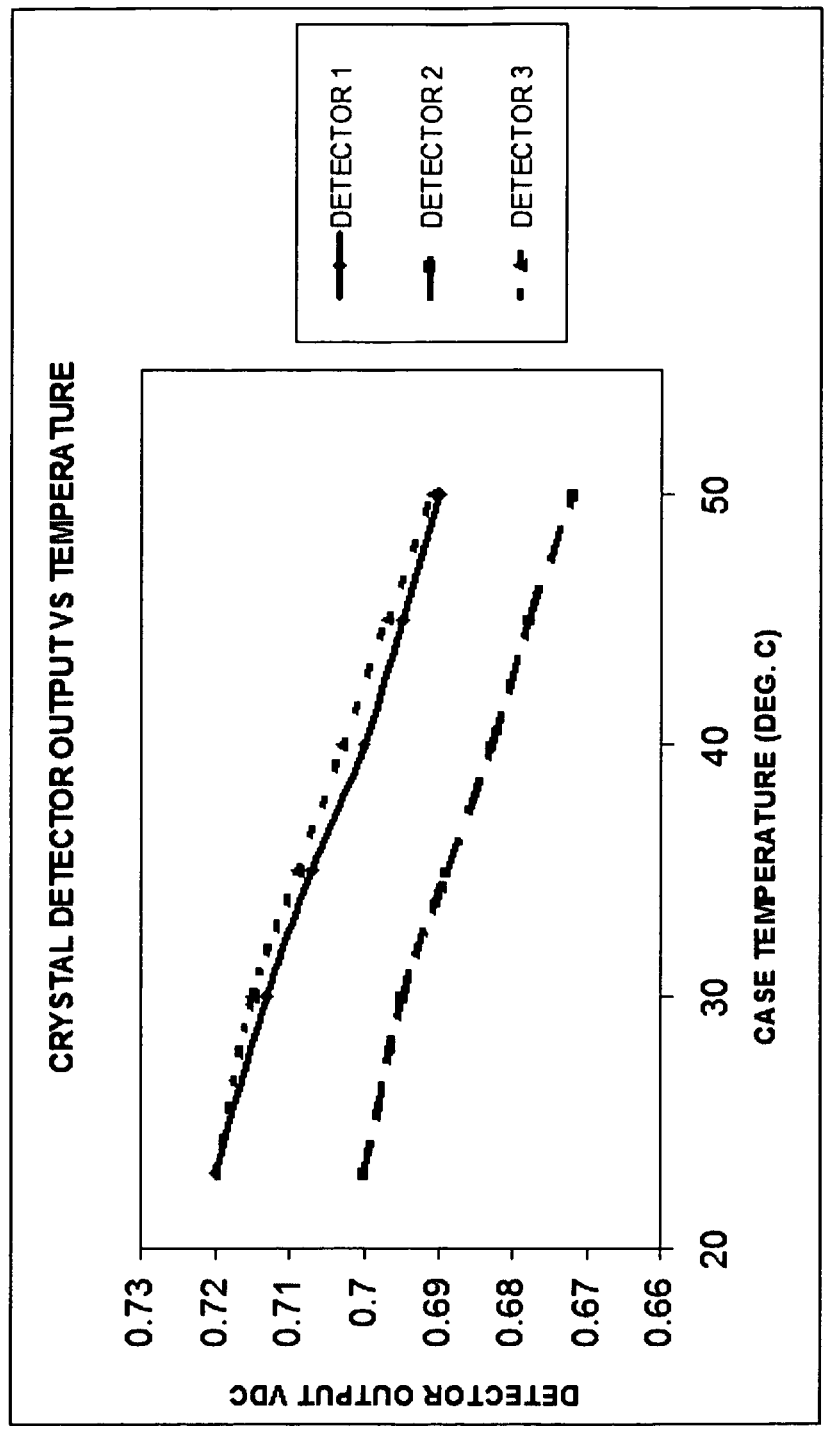
FIG. 4 illustrates the change in crystal detector output versus temperature for several devices.
Figure 11A:
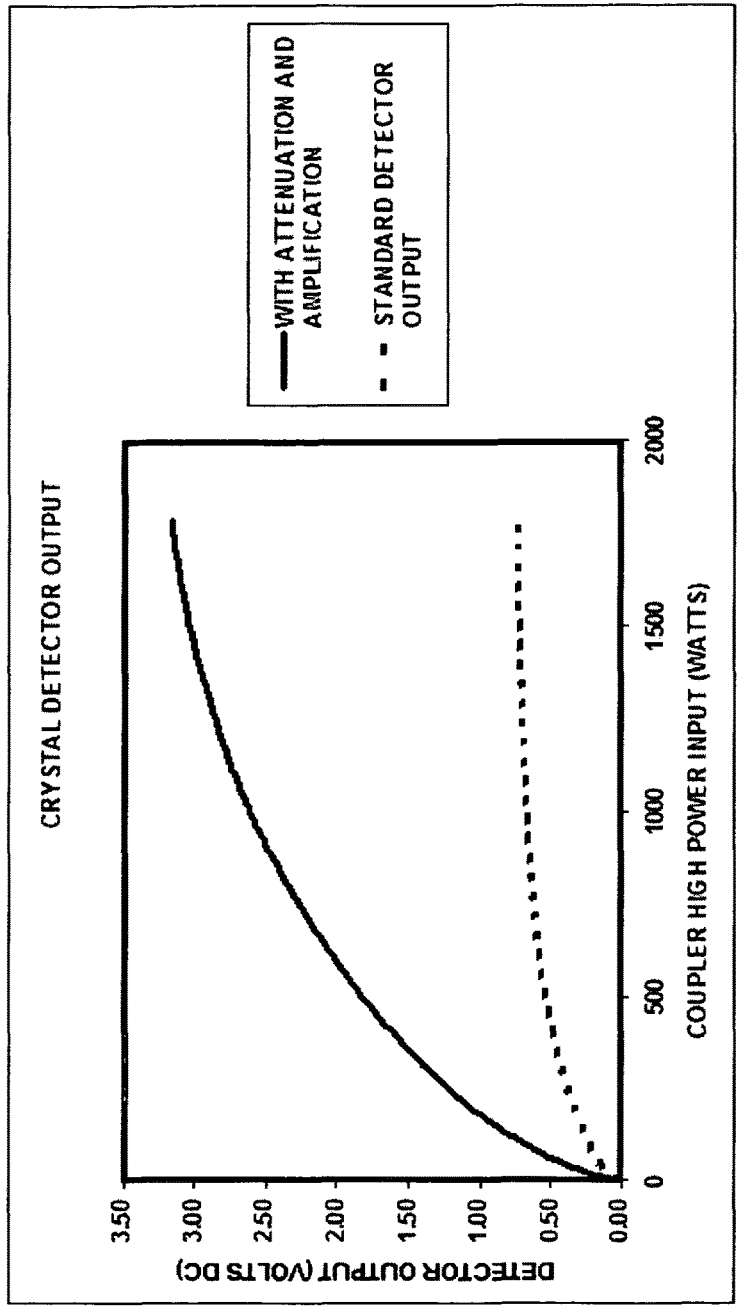
FIG. 11 shows the crystal detector output 11A, with and without attenuation and amplification using the configuration shown in 11B.
Figure 11B:
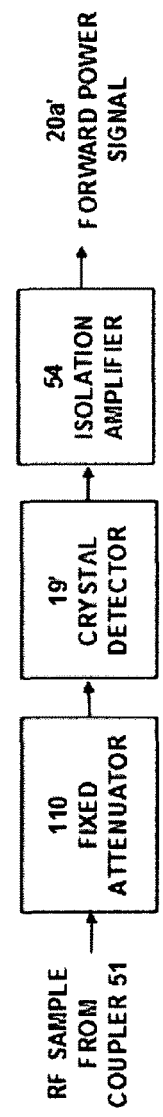

Applicants found significant degradation in amplitude output of the measurement components relative to the local operating environment temperature. FIG. 4 shows the effect on the crystal detectors 19 used to measure RF output on the directional coupler as the local operating environment temperature increased). Applicants further found that crystal detector output saturates (gain rolls off) as the measured power level increases as shown in FIG. 11. This in turn provides poorer signal resolution and a loss of control accuracy. In addition, crystal detectors provide a low level DC signal, typically less than 1 VDC referenced from local ground. Variations in ground potential between the crystal detector location and the control system location introduce significant error into the measurement and thus the accuracy of the power control.

Applicants found that the forward power port of high power measurement devices, such as the directional couplers 16 typically used to measure waveguide power were highly sensitive to reflected power. Reflected power cannot be eliminated when launching into a closed chamber 18. Furthermore, reflected power is a function of launch frequency and process chamber loading. This means that the forward power signal lacks fidelity across the launch spectrum.

Applicants determined that the prior art calibration techniques used to generate uniform microwave output power as a function of frequency were not sufficiently precise or consistent run-to-run. Further improvements in calibration accuracy using the prior art were determined to take exponentially longer times to complete.

As will be shown in the examples that follow, Applicants have discovered that a novel combination of hardware and software features not only greatly improves process uniformity, but has provided unexpected synergies that allow the system to operate in a desirable open-loop process control mode in addition to a traditional closed-loop process control mode.

Applicants have discovered and demonstrated innovations that are in three major categories:

First: Amplitude Stability including: 1. small signal gain stabilization with temperature, and 2. overall large signal stability with respect to drift with a unique automatic power regulation algorithm.

Second: Measurement Integrity including: 3. directional coupler isolation from reflected power, 4. crystal detector stabilization with temperature, 5. Fixed attenuation offset of the crystal detector output to improve the sensitivity range of the crystal detector, 6. ground isolation to remove DC offsets in the microwave power measurement control system and 7. amplification to further increase crystal detector sensitivity for accurate measurements.

Third: Frequency Uniformity including: 8. an advanced autolevel routine that provides precise power resolution, self identifies the high power saturation drive levels, and provides a useful diagnostic history file. One unexpected benefit has been discovery of an algorithm that provides both faster and much more accurate self calibration (Autolevel) operations.

Figure 5:
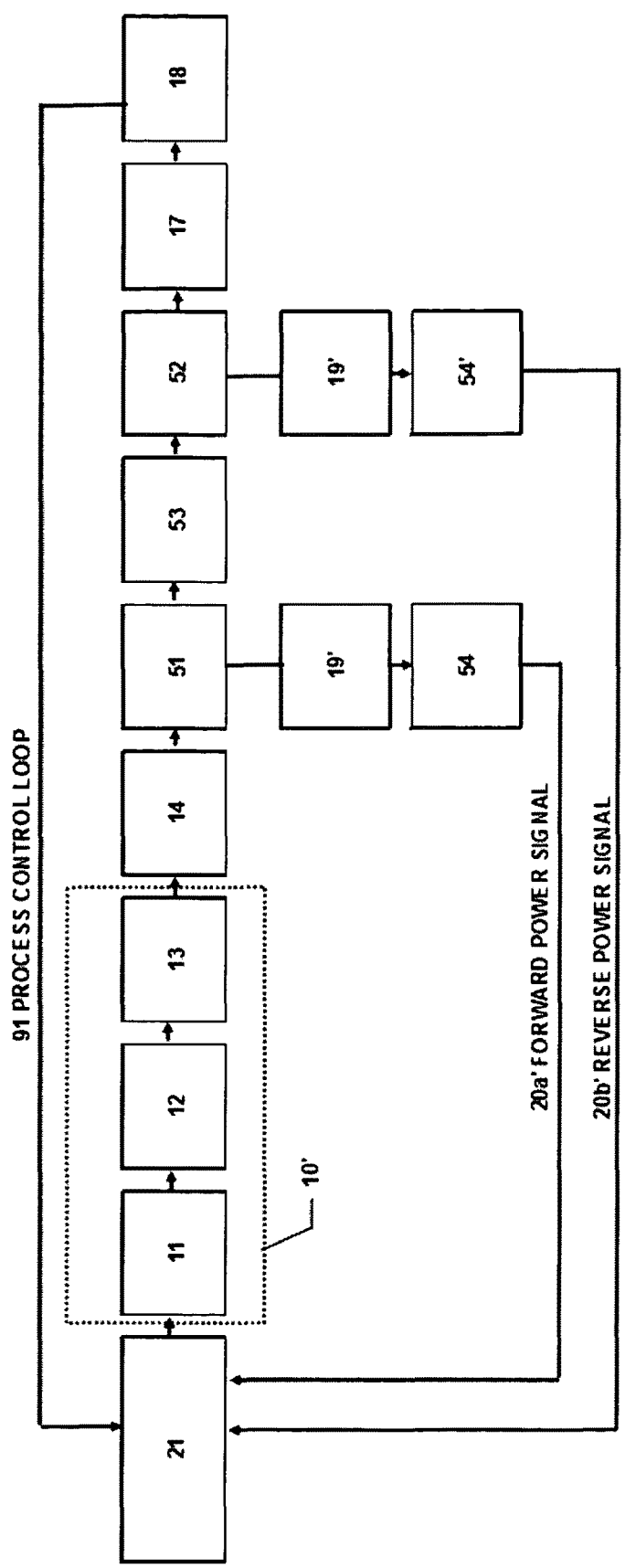
FIG. 5 illustrates the system architecture of the microwave heating system in accordance with one aspect of the invention.

Applicants have discovered that attributes of all three categories are interconnected and must be present in order to obtain high quality control of a broadband microwave power source. It has become clear that precision control of power cannot be done without stable sources and high fidelity measurement. Furthermore, precision control of amplitude vs. frequency for a swept frequency broadband system cannot be done without these same controls. The improved apparatus is shown in FIG. 5 and will be further explained in the following examples.

Figure 6:
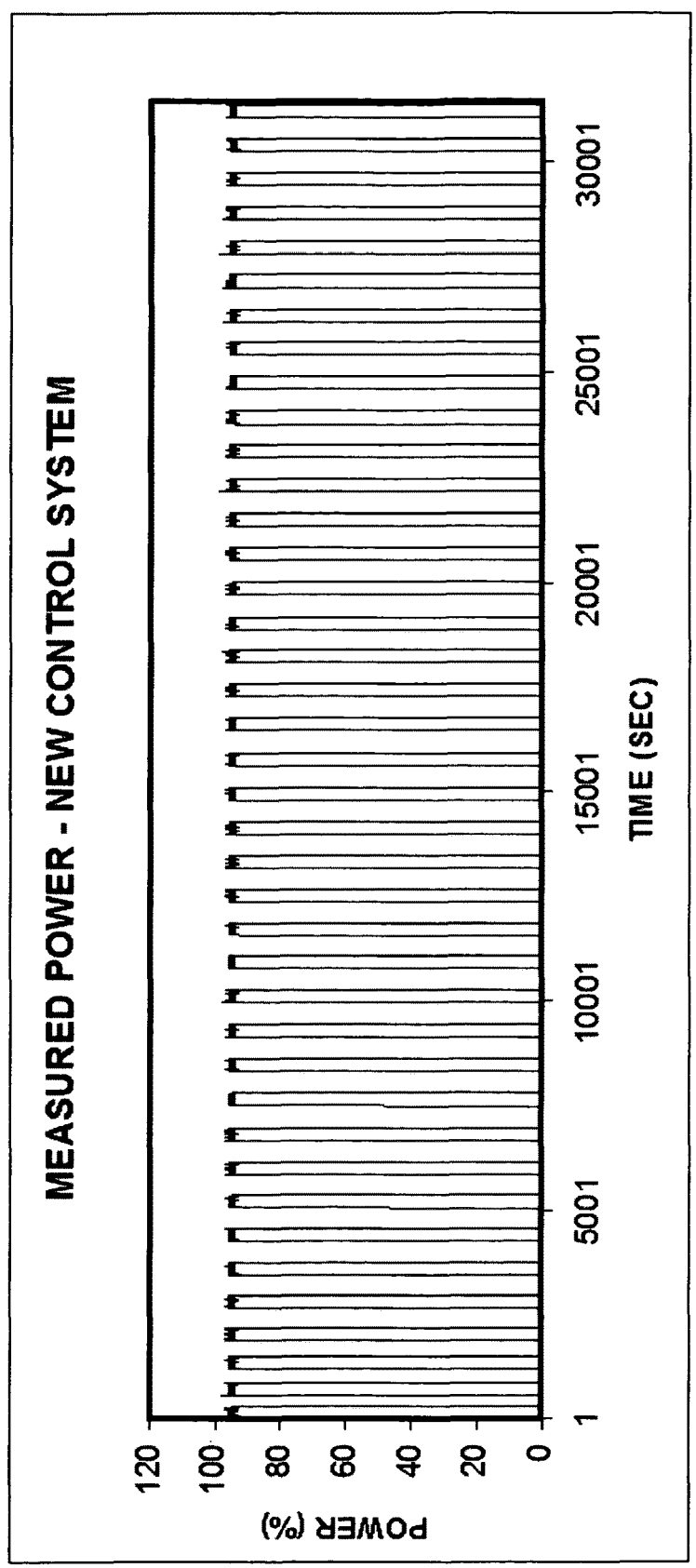
FIG. 6 illustrates the stability and reproducibility of power output in the inventive system.

The surprising and unexpected results of the advanced controls include: 1. improved accuracy, and 2. high run to run repeatability as shown in FIG. 6. These capabilities are required for open loop process control. Furthermore, these capabilities extend broadband microwave suitability to applications where feedback signals are not reliable because of accessibility, noise, or other limits on process measurement.

Example

Figure 1:
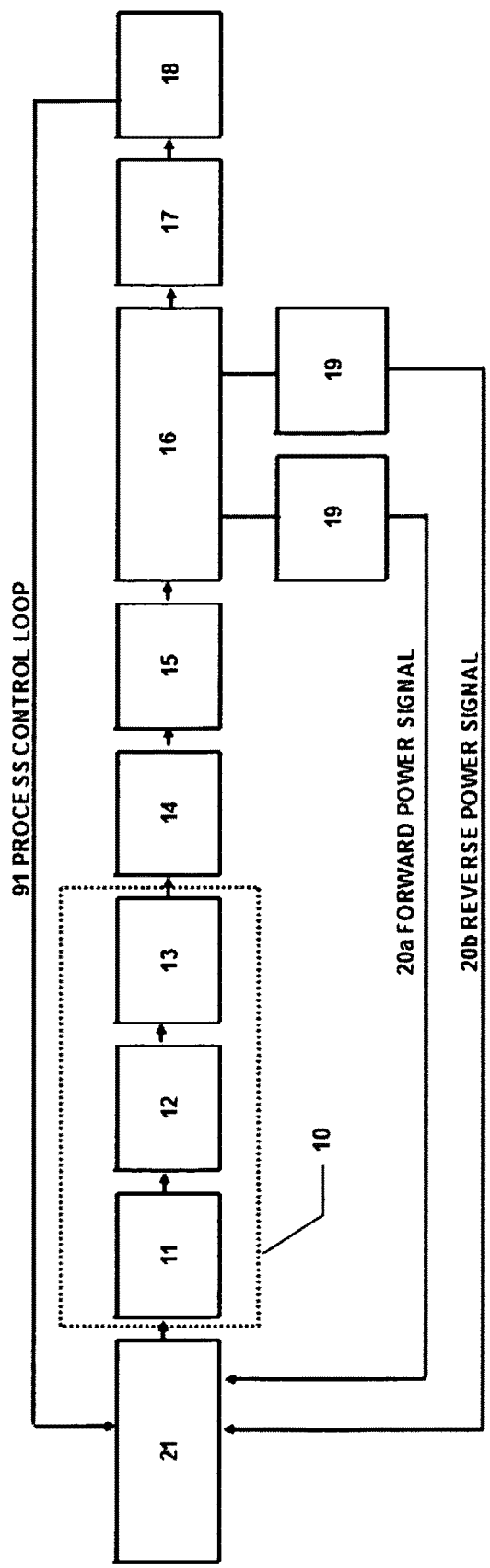
FIG. 1 illustrates the system architecture of the Prior Art microwave heating system.

Small-signal Chain: The various components of the small-signal RF circuit 10 are shown in FIG. 1. The selected microwave frequency is generated by a voltage controlled YIG oscillator (VCO) 11 (e.g. Teledyne 1062 MNAS1062C-DA); it will be understood that any suitable VCO may be used, including solid state devices (e.g. RFMD model RFVC1802).

Initial power level control is done with a voltage controlled attenuator (VCA) 12 (e.g. Pulsar Microwave model AAT-24-479/5SL or Anaren PIN diode attenuator model 61527). Optional components may include a fixed attenuator (e.g.: Inmet Corporation part number 12A-30) and a RF Bandpass Filter 13 (e.g. Lark Filter part number 4B6250-H800-6AA). Each of the aforementioned components will have some characteristic temperature coefficient as shown for the case of the YIG oscillator in FIG. 3. This may be dealt with by either of two approaches: 1. The thermal behavior of each component may be mapped and incorporated as a variable into the control system; or, 2. A particular component may be intentionally heated to a temperature that is above any expected ambient temperature but below the upper operating limit of that component (typically 30 to 50° C.). Option 2 is sometimes referred to as "ovenizing" and is occasionally employed in precision measurement equipment, for example to eliminate frequency drift in a crystal oscillator (see, e.g., U.S. Pat. No. 5,770,977, issued Jun. 23, 1998 to Uurtamo) but to Applicants' knowledge the approach has never been tried in microwave power systems to account for amplitude stability, or other types of temperature-dependent physical or electrical phenomena.

Figure 7:
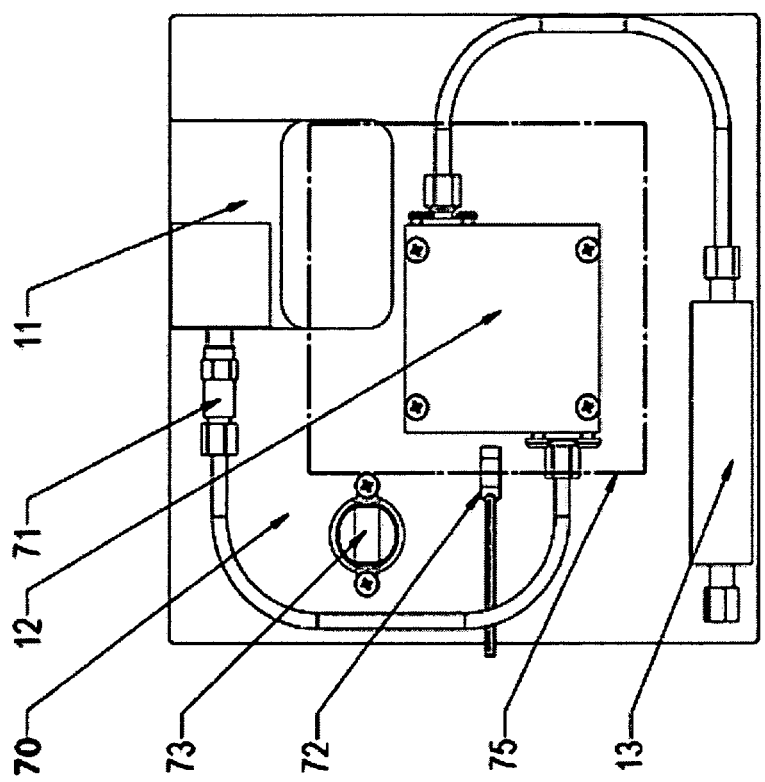
FIG. 7 illustrates a thermally stabilized small-signal RF circuit in accordance with one aspect of the invention.

As shown in FIG. 7, Applicants have discovered that by mounting the entire small-signal RF chain on a common platform 70, the entire chain can be "ovenized" to a single temperature by a backside heater 75, controlled using temperature sensor 72 and safety thermostat 73, leading to remarkable amplitude output stability of the small-signal RF circuit. The result is a stabilized small signal RF circuit 10'.

It will be understood that it is within the scope of the invention to ovenize the components individually, as may be needed if one of the control components such as the VCA is located in a TWTA. However, the synergy of eliminating independent thermally-related variations in the individual components surprisingly simplifies the overall system control process. It is particularly convenient and efficient to ovenize the entire small signal chain because these components are most often closely coupled.

Example

Figure 8:
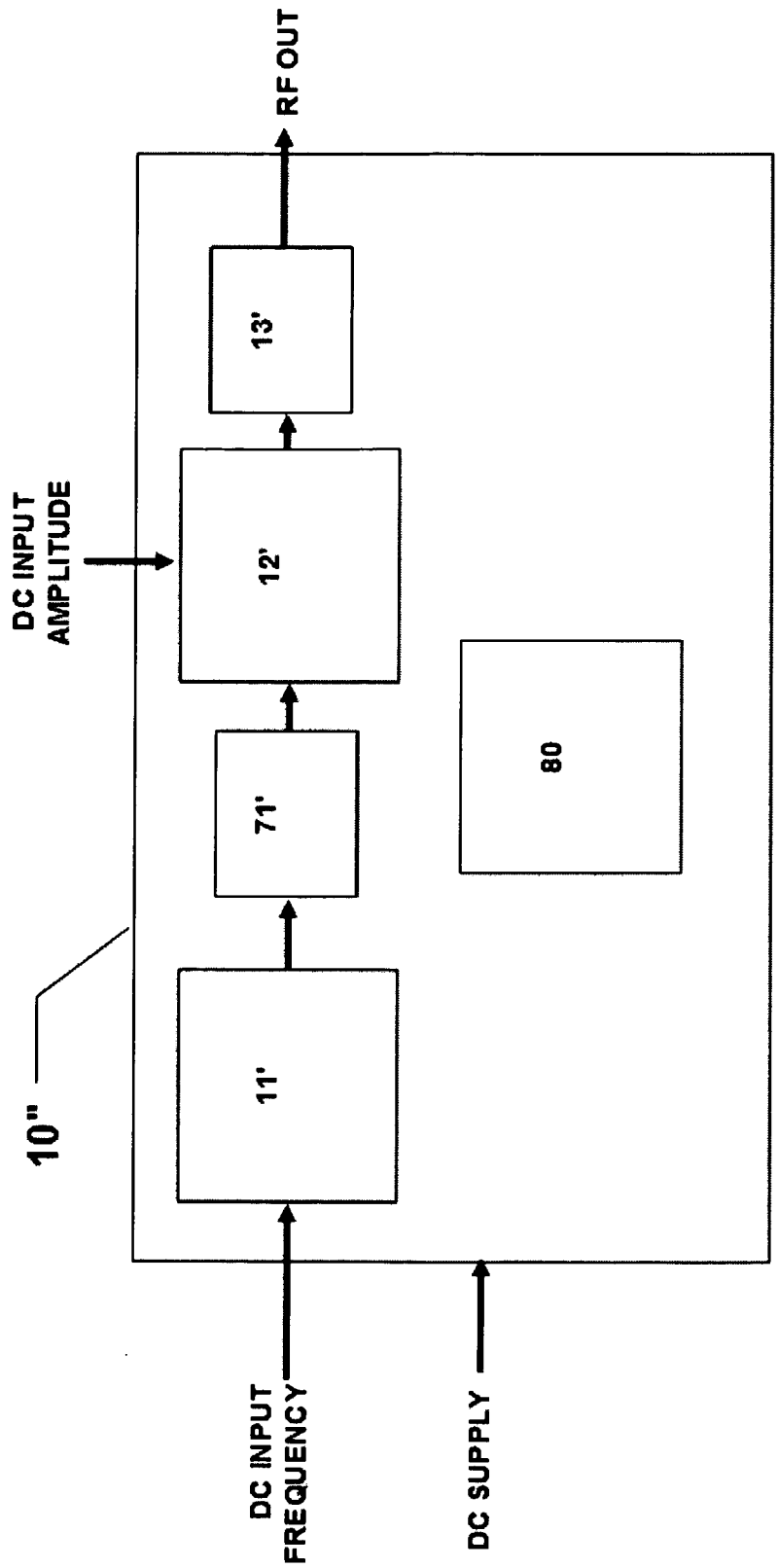
FIG. 8 illustrates an integrated, thermally stabilized small-signal RF circuit in accordance with one aspect of the invention.

Small-signal Chain: The various components of the improved small-signal RF circuit 10' may be further consolidated into a hybrid module (10"). An example is shown in FIG. 8 where the VCO (11'), optional Fixed Attenuator 71', VCA 12', and optional RF Bandpass Filter 13' are integrated as components onto a PCB or hybrid module. This module may further incorporate a self contained, self controlled heater and control circuit module 80. Such an integrated, stabilized RF circuit is suitable for incorporating into all manner of devices including test equipment, communications equipment, and the like, using any conventional interconnect methods.

Power Measurement: Improved power control is only as good as the accuracy of the power measurement. The established art for power measurement in a microwave system is to use a coupler to create a low level RF signal and a crystal detector to convert the RF signal to a DC control voltage.

Couplers such as Apollo Microwaves p/n 16160-3, or Lieder Development p/n L137CG-50SF-CF-5.85-7.0, include a strategically located sample port in the main waveguide. Leakage from this port into a cross guide provides an attenuated RF power sample. Applicant has found through investigation and experimentation that the typical directional coupler has significant sensitivity to reflected power that comes from the process chamber. The ratio of the reflected power effect on the forward power measurement is called directivity. Cross guide couplers are typically limited to directivity of −15 to −25 dB.

FIG. 9A shows the prior art configuration. RF power is delivered to the transmission line by an adaptor 81 (e.g. Maury Microwave Corp. C211D) and directed through the directional coupler 16 into a dummy load 82. The dummy load absorbs all the power and there is no reflected power. FIG. 9C shows the same configuration with power being delivered into a short 83. The short reflects all the power. From the difference between the S21 frequency response graphs, FIGS. 9B and 9D, it is obvious that the measured forward power signal 20a is corrupted by the reflected power signal.

Alternate designs of couplers can provide improved directivity, but at a prohibitive increase in size and cost. These make the alternate designs impractical for use in production microwave systems.

Example

Applicants have discovered a novel solution that incorporates splitting the forward and reflected power measurement couplers and relocating the forward power coupler to the source side of the existing isolator. FIGS. 10A and 10C show the forward power coupler 51 and reflected power coupler 52 separated by isolator 53. Isolator 53 shown in FIGS. 10A and 10C may be the same design as isolator 15 shown in FIG. 1. This unique solution provides high fidelity for the forward power signal and maintains all present capabilities of the power measurement design, with a small change in size and nominal increase in cost.

Figure 10B:
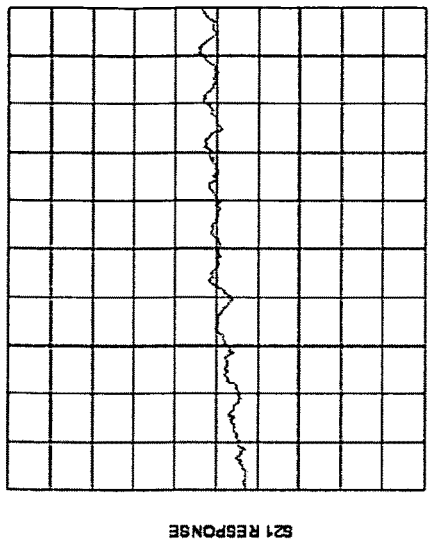
FIG. 10 compares forward power measurements 10B, 10D into a dummy load 10A, and into a short 10C, respectively, using the configuration of the present invention.
Figure 10D:
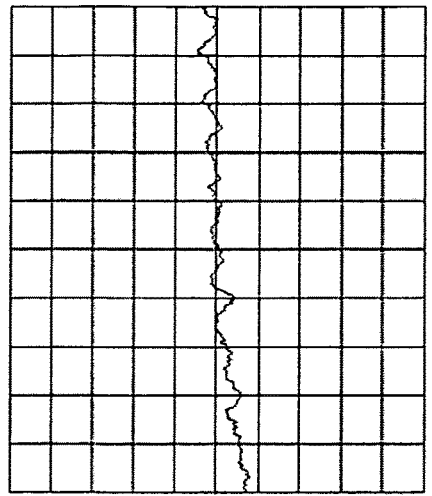
Figure 10A:
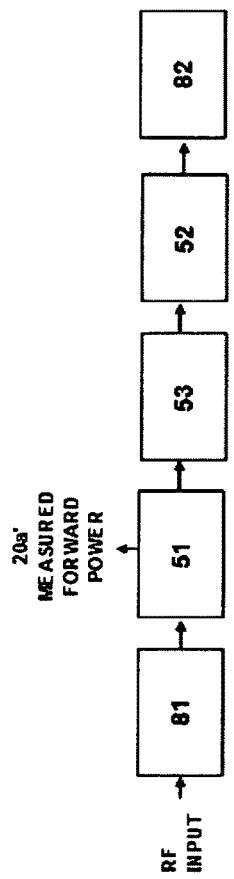
Figure 10C:
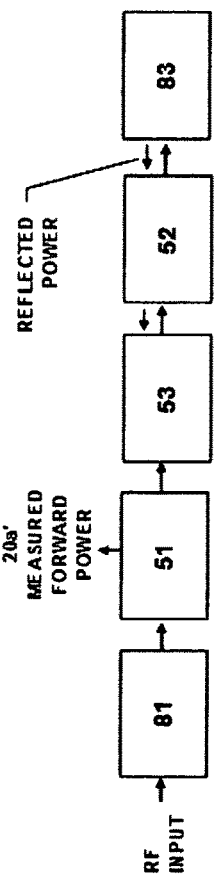

As shown in S21 measurement plots in FIGS. 10B and 10D the effect of reflected power between a dummy load 82 and a short 83 is mitigated. However, to ensure the accuracy of the forward power measurement relative to the process chamber in both amplitude and frequency, Applicants have further identified the need to account for the insertion loss of the isolator 53 in the calibration routine for the directional couplers.

Applicants have discovered that the crystal detector (e.g. Advanced Control Components p/n ACSP-2551) used to convert low level RF power to a DC control voltage has three significant problems when used in a high fidelity control system. The first problem is a significant variation in output voltage as a function of temperature as shown in FIG. 4. The second problem is output roll-off as shown in FIG. 11 (Standard Detector Output) that eventually renders the detector useless for precision control at high power levels. The third problem is that crystal detectors generate their output voltage relative to local ground potential at the coupler and there is often a significant DC offset in ground potential at the measurement control circuit.

Example

By ovenizing the crystal detectors 19' and using a precision temperature controller to maintain the detector at a stable temperature above ambient, Applicants have found a cost effective, stable solution for the temperature sensitivity.

Applicants have further found that attenuating the RF signal from Coupler 51 to the crystal detector 19' by the addition of a fixed attenuator 110 or equivalent improves the operating region resulting in greater DC output sensitivity (measured as VDC/watt).

Applicants have further provided ground isolation in the form of a DC to DC isolation amplifier 54 to ensure that a ground loop or DC level bias between the Crystal Detector and control system is eliminated. This ensures a high fidelity power signal.

Further improvement is obtained by amplifying the DC signal to ensure that it is in the upper/middle range (60% to 80%) of the Analog to Digital converter used by the RF control system 21. Typical DC-DC amplifier gains of 5× are used to obtain 10 or more bits of resolution for each percent of HPA power at the upper end of the range. Without attenuation of the RF signal and subsequent amplification there may be less than 1 bit of digital resolution per percent of HPA power which is inadequate for precision control. For legacy applications where field upgrades may be required to use existing calibration files, the Isolation Amplifier 54 may be equipped with a 1× amplification.

Figure 2:
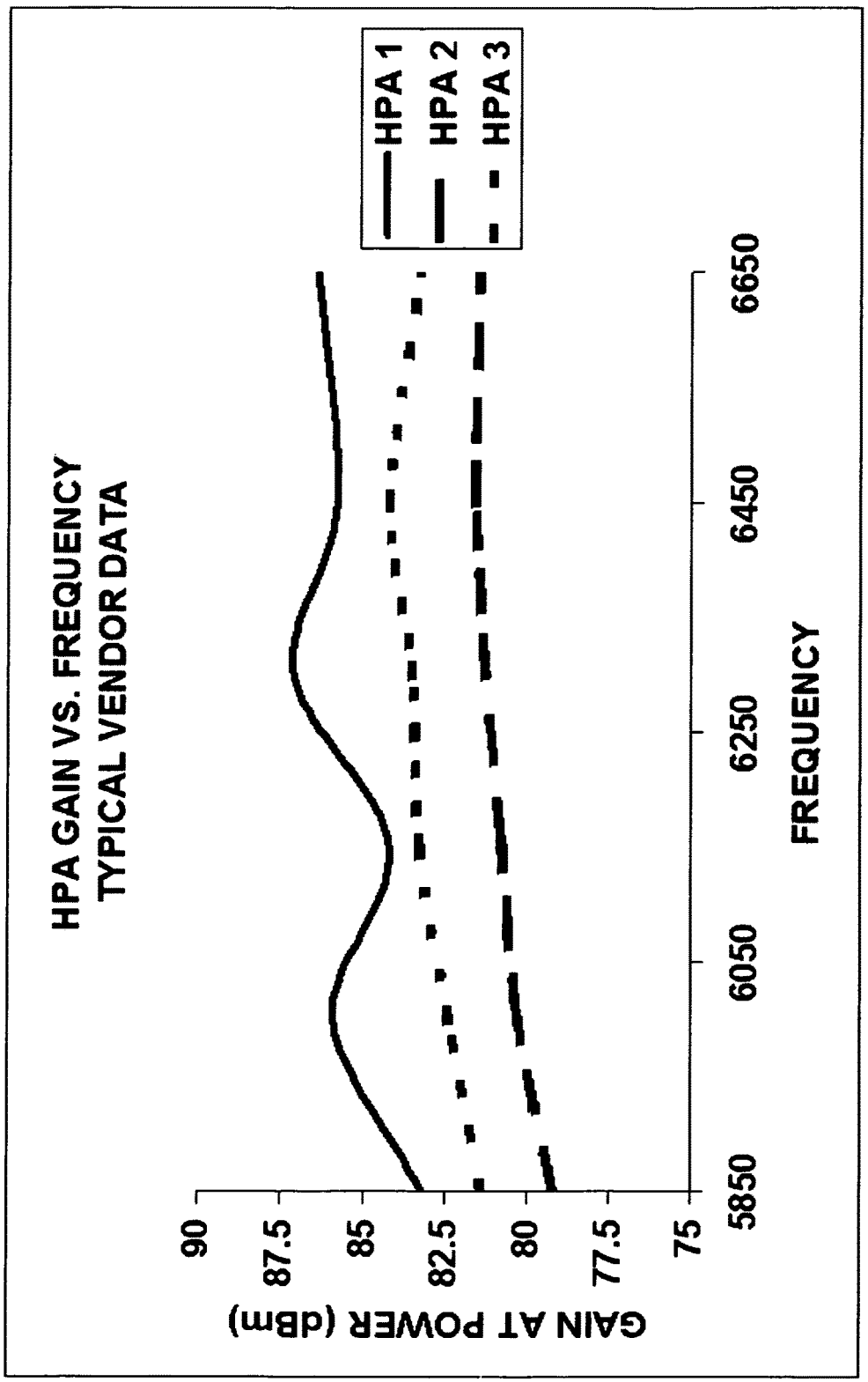
FIG. 2 illustrates schematically the gain versus frequency for several high power amplifiers based on vendor data.

TWT Gain: Prior art in VFM control is designed to remove the non-linear frequency response of the traveling wave amplifier (see FIG. 2) and the transmission line. This is accomplished by a self calibration routine referred to as Autolevel.

Figure 12:
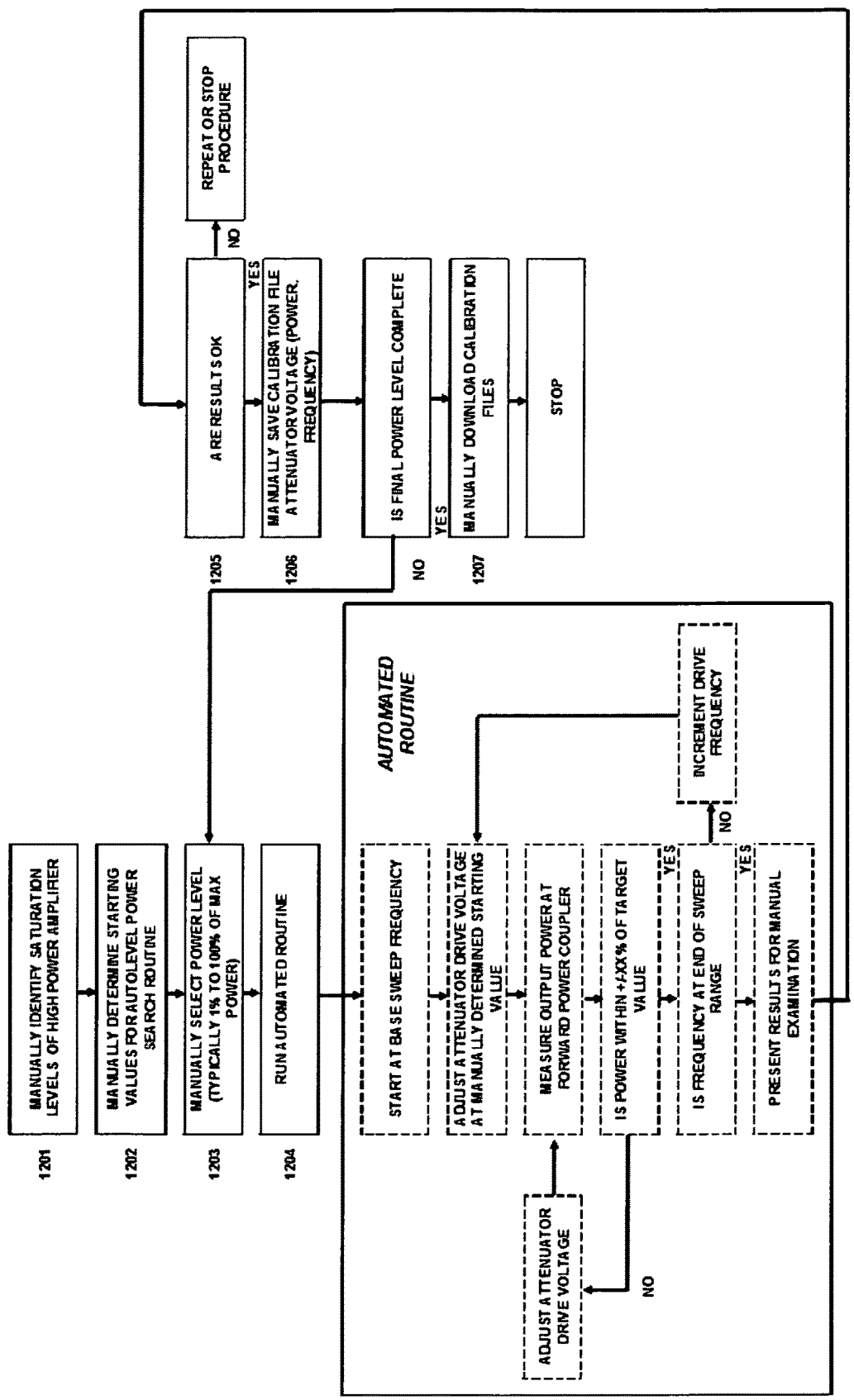
FIG. 12 shows the autolevel process of the Prior Art.

The existing autolevel process involves the steps shown in FIG. 12. These include: 1201 Manually identifying saturation levels of the high power amplifier; 1202 Manually determining starting values for a power search routine; 1203 Selecting a power level; and, 1204 Starting an automated routine to generate an autolevel for a selected discrete power level. For each frequency in the swept band the routine adjusts the voltage controlled attenuator to obtain a measured output power level at the forward power coupler within +/−10% of the selected discrete power level. The settings for the voltage controlled attenuator at that specific frequency are then stored in a table that is used in run-time operation. The next frequency is selected by the auto-level routine and the process is repeated until the full band is covered. 1205 Upon completion of the automated routine the operator must manually review the results and either accept (save the file) or repeat the process. 1206 the operator then selects another discrete power level and the routine is repeated. This is done until all power levels have been autoleveled. 1207 Upon completion of all power levels, the operator must then download the autolevel files to a control system.

The leveled powers generated by this process are normally sufficient for closed loop processes where a process control input (e.g., a temperature measurement) is used to call for more or less power to achieve a target temperature.

However this level of power accuracy is not sufficient for a repeatable precision process or a process where open loop process control is needed. An open-loop process is typically defined as one where there are no automatic adjustments done by the control system.

As described in the following example a new technique for the autolevel process was invented to improve the fidelity of the power response versus frequency.

Example

In this new autolevel process: 1301 the operator starts the fully automated autolevel routine; 1302 the autolevel routine automatically selects a starting frequency (currently it works from low to high, but this is not required) and 1303 adjusts the voltage controlled attenuator to a set point. 1304 The system records the power output at that setting. The voltage controlled attenuator is set to the next set point and the power level is recorded for that setting. 1305 This process is repeated until the routine detects saturation. Saturation is defined as the point at which an increase in input drive results in no increase (or a decrease) in output power from the high power amplifier. 1306 The routine stores the saturation power level in a diagnostic file. The autolevel routine automatically selects the next sample frequency and repeats the above process. The next frequency may be separated by a large measure from the first.

Applicants have discovered, surprisingly, that attenuator measurements at 65 discrete frequency intervals (64 sub-bands) can be sufficient to improve on the prior art which required power measurements and attenuator adjustments at each of the nominal 4096 frequencies used in the prior art calibration. The new technique has been demonstrated on a typical 800 MHz to 1 GHz swept frequency band. It will be appreciated that more discrete frequency levels may be desirable where multi-octave TWTs and passive components have greater variability across the broader bandwidths of operation. The advantage of this invention is that the strategic sampling will be a more efficient calibration method.

1307 Once the routine completes the necessary sampling of frequency scans, it will automatically generate an autolevel table. 1308 This table is then automatically downloaded to the control system. All of the above operations are automatic and do not require operator intervention.

Figure 14B:
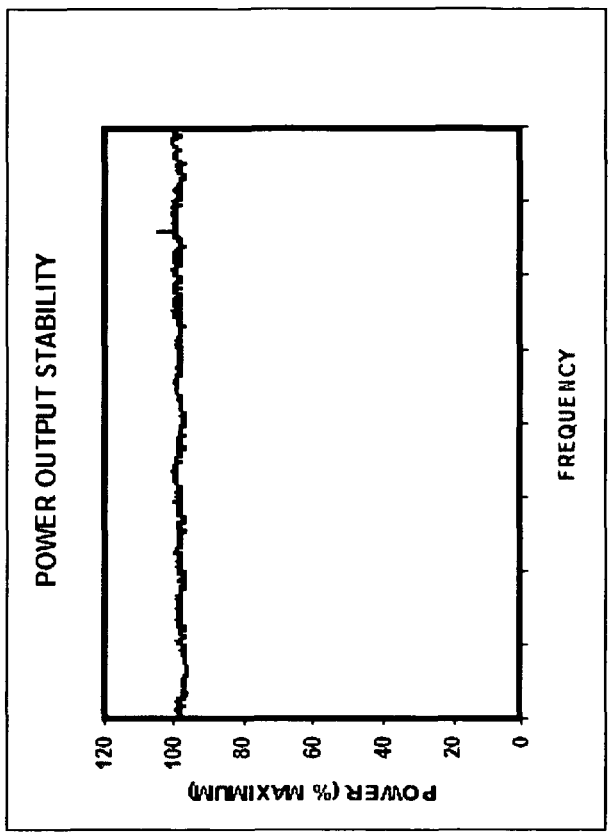
FIG. 14 compares the power output across the frequency band using the present invention, 14B and using the Prior Art, 14A.
Figure 14A:
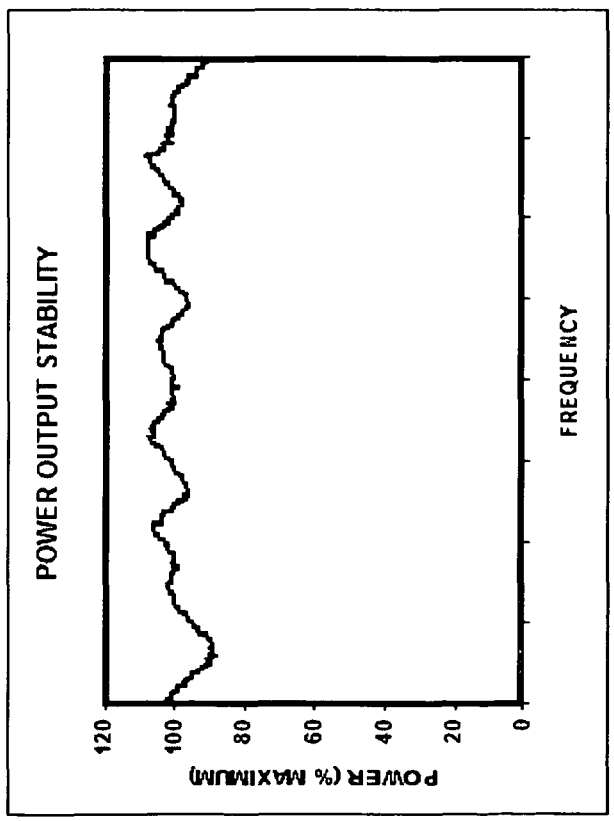

The unique and novel capabilities of the new autolevel process are: 1. improved fidelity of power versus frequency as shown in FIGS. 14A and 14B; 2. Fully automatic operation; 3. Diagnostic file automatically generated for maintenance history; 4. Faster completion by strategic sampling of the frequency/power map rather than point by point completion; and 5. Compatibility with previous autolevel file formats Example The novel methodology of generating the autolevel table by strategic sampling includes the use of a spline based surface fitting routine 1307 The surface fitting routing accepts a two-dimensional array of data representing the observed forward power as a function attenuation setting (row) and drive frequency (columns). The curve fitting routine fits C-splines to the input data and extracts autolevel files that have attenuation setting as a function of frequency at constant power.

In the present configuration, a C-spline curve fit is used to generate a 3-D autolevel data surface. Alternate curve fitting routines could also be used. It will be appreciated that in the present configuration the algorithm could be integrated or run separately as a subroutine.

System Controls: Automatic power regulation. Applicant has discovered there remain additional components within the microwave control system with thermal sensitivity that cannot be practically isolated in a controlled environment due to their size and power requirements. Furthermore some of these components such as the high power amplifier have a time-based drift that is not a function of the environment as shown in FIG. 15.

Example

Figure 16:
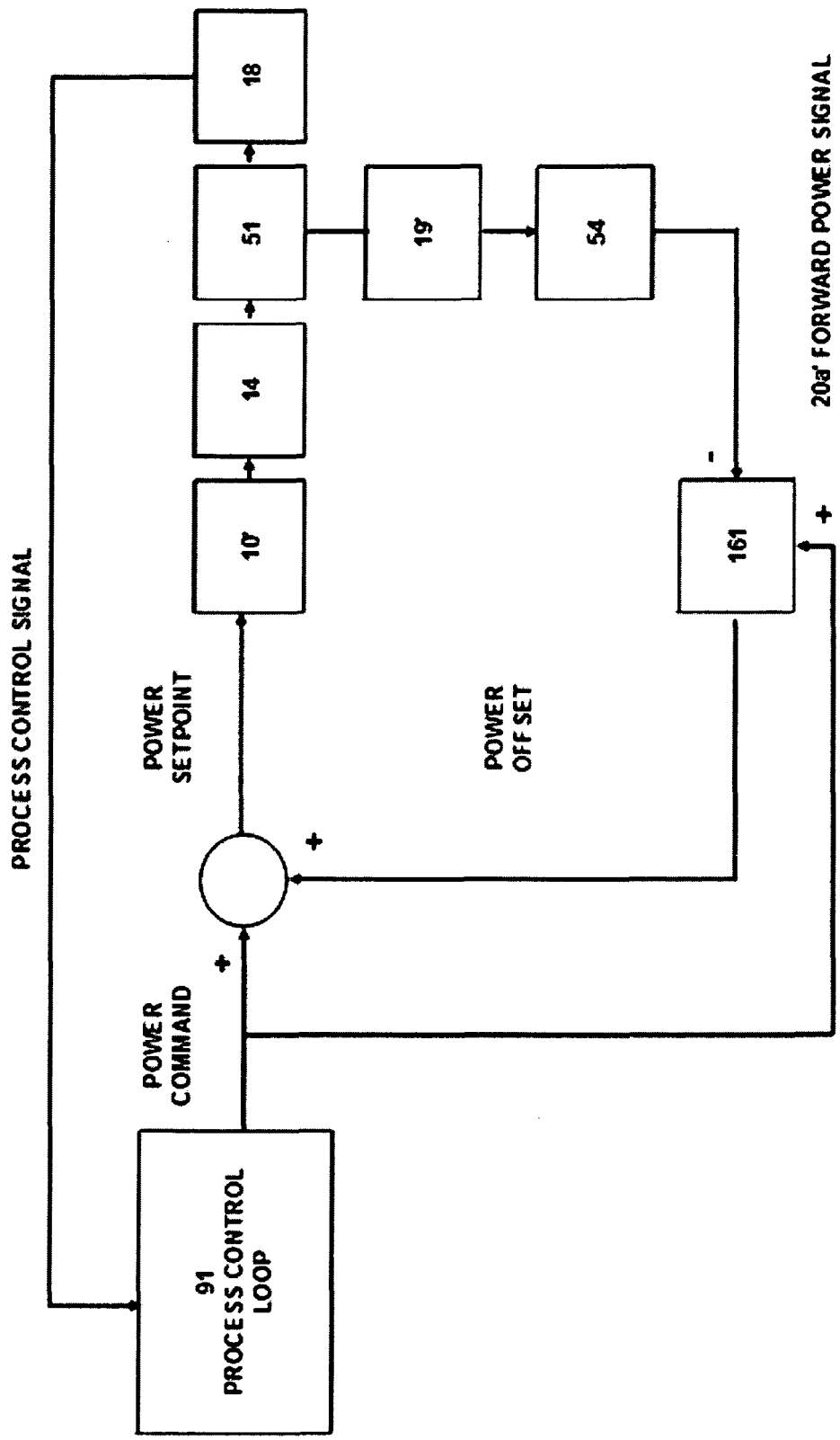
FIG. 16 illustrates the architecture for automatic forward power regulation in accordance with one aspect of the invention.

To ensure stable and repeatable power, Applicants have developed a novel control routine as shown in FIG. 16. This control routine provides automatic power regulation to provide corrected drive levels. Should the measured forward power signal 20$a'$ be high or low for any reason, the power regulator 161 output will be added to the current power command to generate an improved power setpoint.

The power control algorithm relies on the accuracy of the forward power measurement. This means that the isolated forward power measurement 51, ovenized crystal detector 19', PAD offset, amplification/ground isolation 54 mentioned above are related to successful implementation of the algorithm.

The power control algorithm contains two important functions. The first is a limit on the rate of power adjustment to avoid too rapid a response. The second is a sensor "leash" that prevents adjustments beyond a preset amount. Alarms are set to notify the master control that the system is not able to maintain accurate power control.

We claim:

1. A broadband microwave heating apparatus, comprising:
   an applicator cavity for exposing a workpiece to microwave energy;
   a microwave power supply connected to the cavity, the power supply comprising:
   a small-signal RF source comprising at least a voltage controlled microwave oscillator and a voltage controlled attenuator that are both thermally stabilized at a selected temperature above ambient;
   a two port microwave amplifier to amplify a signal from the small-signal RF source to a usable power level for heating;
   forward and reflected power detectors, the detectors separated from one another by a microwave isolator, wherein the forward power detector is located upstream of the microwave isolator;
   a power regulator configured to determine a difference between a forward power detected by the forward power detector and a power setting of the microwave power supply; and a control system including a power control loop and configured to use an output of the power regulator to adjust an output power of the microwave power supply based on the determined difference between the forward power detected by the forward power detector and the power setting of the microwave power supply, a heater; at least one of a temperature sensor or a thermostat; wherein all of the small-signal RF source are mounted on a common thermal platform and maintained at a common temperature above an ambient temperature, wherein the heater is controlled by the at least one of a temperature sensor or the thermostat.

2. The apparatus of claim 1, wherein the small-signal RF source further includes a fixed attenuator and a bandpass filter.

3. The apparatus of claim 1, wherein the forward and reflected power detectors are thermally stabilized at a selected temperature above ambient.

4. A broadband microwave power supply, comprising:
a small-signal RF source comprising at least a voltage controlled microwave oscillator (VCO) and a voltage controlled attenuator (VCA) that are both thermally stabilized at a selected temperature above ambient;
a microwave amplifier to amplify a signal from the small-signal RF source to a usable power level for heating;
forward and reflected power detectors, the detectors separated from one another by a microwave isolator, wherein the forward power detector is located upstream of the microwave isolator;
a power regulator configured to determine a difference between a forward power detected by the forward power detector and a power setting of the microwave power supply; and
a control system including a power control loop and configured to use an output of the power regulator to adjust an output power of the microwave power supply based on the determined difference between the forward power detected by the forward power detector and the power setting of the microwave power supply,
a heater; at least one of a temperature sensor or a thermostat; wherein all of the small-signal RF source are mounted on a common thermal platform and maintained at a common temperature above an ambient temperature, wherein the heater is controlled by the at least one of a temperature sensor or the thermostat.

5. The broadband microwave power supply of claim 4, wherein the small-signal RF source further includes a fixed attenuator and a bandpass filter.

6. The broadband microwave power supply of claim 4, wherein the forward and reflected power detectors are thermally stabilized at a selected temperature above ambient.

7. The broadband microwave power supply of claim 4, further comprising:
a heater and temperature control circuit; and,
a package containing the VCO, VCA, heater, and temperature control circuit and having external connections for DC power, DC frequency control voltage, DC amplitude control voltage, and RF signal out.

8. The broadband microwave power supply of claim 7, wherein the package comprises a printed circuit board.

9. The broadband microwave power supply of claim 7, wherein the package comprises a hybrid circuit module.

10. A method of heating materials using broadband microwave power, comprising:
placing a selected workpiece in a multi-mode microwave applicator cavity;
providing a microwave power supply in communication with the cavity, the power supply including a small-signal RF generating circuit, a microwave amplifier, and forward and reflected power detectors, the detectors separated from one another by an isolator;
heating at least some of the components of the small-signal RF generating circuit to a selected temperature above ambient, a heater; at least one of a temperature sensor or a thermostat; wherein all of the small-signal RF source are mounted on a common thermal platform and maintained at a common temperature above an ambient temperature, wherein the heater is controlled by the at least one of a temperature sensor or the thermostat;
providing a control system to perform the following functions:
run an automatic power leveling routine to automatically generate an autolevel table and download the autolevel table to the control system;
provide an automatic power control system to limit the rate of power adjustment; and,
applying microwave power into the applicator cavity under the control of the control system to heat the workpiece, wherein the control system uses a power regulator to adjust an output power of the microwave power supply based on a comparison between a forward power detected by the forward power detector and a power setting of the microwave power supply.

11. The method of claim 10, wherein the automatic power leveling routine includes a spline-based surface fitting routine.

12. The method of claim 10, further including the step of heating the forward and reflected power detectors to a selected temperature above ambient.

13. The method of claim 10, wherein the automatic power control system further includes a limiter that prevents adjustments beyond a preset amount.

14. The method of claim 10, wherein the automatic power control system includes an alarm function to notify the master control if the system is not able to maintain accurate power control.

15. The apparatus of claim 1, wherein respective isolation amplifiers are disposed between each one of the detectors and the control system, and a crystal detector that is maintained at the common temperature above ambient is disposed between the respective isolation amplifiers and each one of the detectors.

16. The broadband microwave heating apparatus of claim 1, wherein the microwave isolator has two ports.

17. The broadband microwave power supply of claim 4, wherein the microwave isolator is a three-port directional coupler having a terminated port.

* * * * *